(12) United States Patent
Li et al.

(10) Patent No.: US 8,675,401 B2
(45) Date of Patent: *Mar. 18, 2014

(54) SPIN-TRANSFER TORQUE MEMORY SELF-REFERENCE READ METHOD

(71) Applicant: Seagate Technology LLC, Cupertino, CA (US)

(72) Inventors: Hai Li, Eden Prairie, MN (US); Yiran Chen, Eden Prairie, MN (US); Hongyue Liu, Maple Grove, MN (US); Kang Yong Kim, Boise, ID (US); Dimitar V. Dimitrov, Edina, MN (US); Henry F. Huang, Apple Valley, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/847,135

(22) Filed: Mar. 19, 2013

(65) Prior Publication Data

US 2013/0215674 A1 Aug. 22, 2013

Related U.S. Application Data

(60) Division of application No. 13/349,052, filed on Jan. 12, 2012, now Pat. No. 8,411,495, which is a continuation of application No. 12/147,723, filed on Jun. 27, 2008, now Pat. No. 8,116,122.

(51) Int. Cl.
*G11C 11/00* (2006.01)

(52) U.S. Cl.
USPC ........ 365/158; 365/148; 365/171; 365/225.5; 365/243.5; 977/933

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 216/22; 257/421, E21.665; 438/3; 428/810–816, 817–825.1, 826; 977/933–935

See application file for complete search history.

(56) References Cited

U.S. PATENT DOCUMENTS

| 6,317,356 B1 | 11/2001 | Hoffmann |
| 6,870,760 B2 | 3/2005 | Tsang |
| 7,102,946 B2 | 9/2006 | Pelella |

(Continued)

OTHER PUBLICATIONS

Hosomi et al., A Novel Nonvolatile Memory with Spin Torque Transfer Magnetization Switching: Spin-RAM, 2005, IEEE.

*Primary Examiner* — Harry W Byrne
(74) *Attorney, Agent, or Firm* — Mueting Raasch & Gebhardt PA

(57) ABSTRACT

A spin-transfer torque memory apparatus and self-reference read schemes are described. One method of self-reference reading a spin-transfer torque memory unit includes applying a first read current through a magnetic tunnel junction data cell and forming a first bit line read voltage. Then applying a low resistance state polarized write current through the magnetic tunnel junction data cell, forming a low second resistance state magnetic tunnel junction data cell. A second read current is applied through the low second resistance state magnetic tunnel junction data cell to forming a second bit line read voltage. The method also includes comparing the first bit line read voltage with the second bit line read voltage to determine whether the first resistance state of the magnetic tunnel junction data cell was a high resistance state or low resistance state.

20 Claims, 7 Drawing Sheets

(56) References Cited

U.S. PATENT DOCUMENTS

| | | |
|---|---|---|
| 7,123,505 B2 | 10/2006 | Jeong |
| 7,170,782 B2 | 1/2007 | Conley |
| 7,187,577 B1 | 3/2007 | Wang |
| 7,224,601 B2 | 5/2007 | Panchula |
| 7,272,034 B1 | 9/2007 | Chen |
| 7,272,035 B1 | 9/2007 | Chen |
| 7,289,356 B2 | 10/2007 | Diao |
| 7,345,912 B2 | 3/2008 | Luo |
| 7,379,327 B2 | 5/2008 | Chen |
| 7,502,249 B1 | 3/2009 | Ding |
| 7,515,457 B2 | 4/2009 | Chen |
| 7,750,421 B2 * | 7/2010 | Horng et al. .................. 257/421 |
| 7,851,840 B2 * | 12/2010 | Diao et al. .................. 257/295 |
| 7,957,179 B2 * | 6/2011 | Ding et al. .................. 365/158 |
| 7,982,275 B2 * | 7/2011 | Nagai et al. .................. 257/421 |
| 2006/0013039 A1 | 1/2006 | Braun |
| 2006/0098498 A1 | 5/2006 | Jeong |
| 2006/0233018 A1 | 10/2006 | Tanizaki |
| 2008/0061388 A1 * | 3/2008 | Diao et al. .................. 257/421 |
| 2008/0310213 A1 | 12/2008 | Chen |
| 2008/0310215 A1 * | 12/2008 | Ueda .............................. 365/158 |
| 2008/0310219 A1 * | 12/2008 | Chen et al. .................. 365/173 |
| 2009/0027810 A1 * | 1/2009 | Horng et al. ............... 360/324.2 |
| 2009/0027811 A1 * | 1/2009 | Guo ........................... 360/324.2 |
| 2009/0040855 A1 | 2/2009 | Luo |
| 2009/0185410 A1 | 7/2009 | Huai |
| 2009/0256220 A1 * | 10/2009 | Horng et al. .................. 257/421 |
| 2010/0214835 A1 * | 8/2010 | Ding et al. .................. 365/173 |

\* cited by examiner

SPIN-TRANSFER TORQUE MEMORY SELF-REFERENCE READ METHOD

CROSS-REFERENCE

This application is a divisional application of application Ser. No. 13/349,052, filed Jan. 12, 2012, which is a continuation of application Ser. No. 12/147,723 filed Jun. 27, 2008, now issued as U.S. Pat. No. 8,116,122 on Feb. 14, 2012, the contents of each is hereby incorporated by reference in its entirety.

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market by 2009. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes severer. Hence, the incurred high power consumption limits the scaling of conventional MRAM.

Recently, a new write mechanism, which is based upon spin polarization current induced magnetization switching, was introduced to the MRAM design. This new MRAM design, called Spin-Torque Transfer RAM (STRAM), uses a (bidirectional) current through the MTJ to realize the resistance switching. Therefore, the switching mechanism of STRAM is constrained locally and STRAM is believed to have a better scaling property than the conventional MRAM.

However, many yield-limiting factors must be overcome before STRAM enters the production stage. One challenge is the large MTJ resistance variation, which is exponentially dependent on the thickness of oxide barrier in it. For example, increasing the thickness of oxide barrier from 14 Angstroms to 14.1 Angstroms changes the MTJ resistance by 8%. This large MTJ resistance variation can create problems during a read operation of the MTJ.

BRIEF SUMMARY

The present disclosure relates to spin-transfer torque random access memory self-reference read operations and apparatus for the same. In particular, present disclosure relates to a spin-transfer torque random access memory self-reference read operation that overcomes the large variation of MTJ resistance.

One illustrative method of self-reference reading a spin-transfer torque memory unit includes applying a first read current through a magnetic tunnel junction data cell and forming a first bit line read voltage, the magnetic tunnel junction data cell having a first resistance state. This first bit line read voltage is then stored in a first voltage storage device. Then the method includes applying a low resistance state polarized write current through the magnetic tunnel junction data cell, forming a low second resistance state magnetic tunnel junction data cell. The method further includes applying a second read current through the low second resistance state magnetic tunnel junction data cell and forming a second bit line read voltage. This second bit line read voltage is stored in a second voltage storage device. Then the method includes comparing the first bit line read voltage with the second bit line read voltage to determine whether the first resistance state of the magnetic tunnel junction data cell was a high resistance state or low resistance state.

Another illustrative method of self-reference reading a spin-transfer torque memory unit includes applying a low resistance state polarized write current through the magnetic tunnel junction data cell and forming a low resistance state magnetic tunnel junction data cell. Then applying a first read current through a magnetic tunnel junction data cell and forming a first bit line read voltage from the low resistance state magnetic tunnel junction data cell. This first bit line read voltage is stored in a first voltage storage device. Then writing a data resistance state into the magnetic tunnel junction data cell, where the data resistance state being either a data high resistance state or a data low resistance state. Then the method includes applying a second read current through the desired resistance state magnetic tunnel junction data cell and to form a second bit line read voltage. This second bit line read voltage is stored in a second voltage storage device. Then the method includes comparing the first bit line read voltage with the second bit line read voltage to determine whether the data resistance state of the magnetic tunnel junction data cell is the data high resistance state or the data low resistance state.

An illustrative spin-transfer torque memory apparatus includes a magnetic tunnel junction data cell having a ferromagnetic free layer and a ferromagnetic reference layer separated by an oxide barrier layer. The magnetic tunnel junction data cell is electrically between a bit line and a source line. The magnetic tunnel junction data cell is configured to switch between a high resistance state and a low resistance state by passing a polarized write current through the magnetic tunnel junction data cell. An adjustable current driver is electrically coupled to the bit line. The adjustable current driver is configured to provide a first read current and a second read current through the magnetic tunnel junction data cell. A first voltage storage device is electrically coupled to the bit line and is configured to store a first bit line voltage formed by the first read current. A second voltage storage device is electrically coupled to the bit line and is configured to store a second bit line voltage formed by the second read current. A differential sense amplifier is electrically coupled to the first voltage storage device and electrically coupled to the second voltage storage device. The differential sense amplifier is configured to compare the first bit line voltage with the second bit line voltage.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to spin-transfer torque memory apparatus and self-reference read methods. In particular, present disclosure relates to self-reference reading methods to determine whether a spin-transfer torque memory unit has a high resistance state or low resistance state data state. The apparatus and methods described herein ensure that the value of the spin-transfer torque memory unit can be determined regardless of the resistance variation of the spin-transfer torque memory units within a memory array. The read voltage of the spin-transfer torque memory unit in an original state and a low resistance state are stored sequentially and compared to detect the original value of the spin-transfer torque memory unit. While the present disclosure is not so limited, an appreciation of various aspects of the disclosure will be gained through a discussion of the examples provided below.

Figure 1:
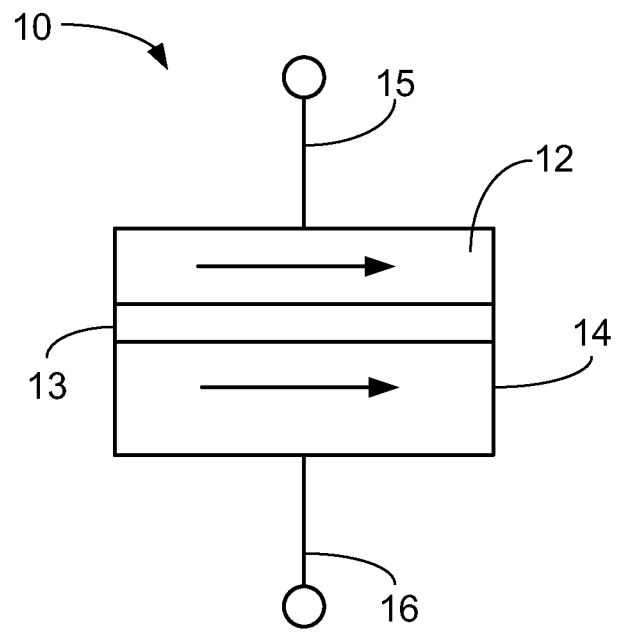
FIG. 1 is a cross-sectional schematic diagram of an illustrative spin-transfer torque MTJ memory unit in the low resistance state.
Figure 2:
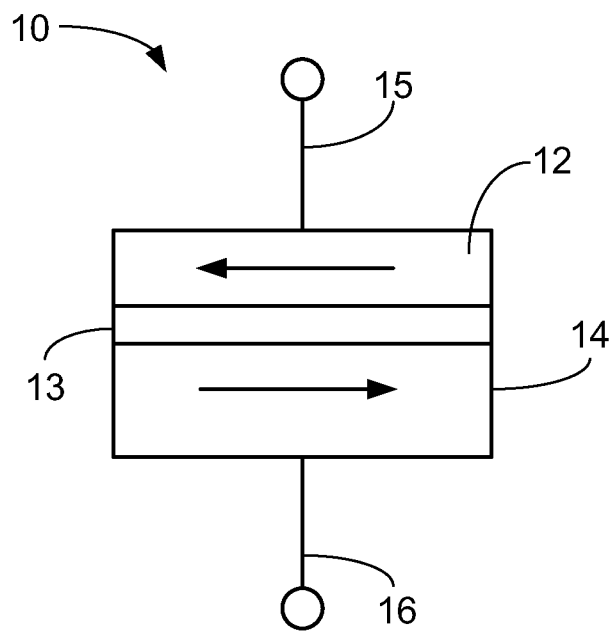
FIG. 2 is a cross-sectional schematic diagram of another spin-transfer torque MTJ memory unit in the high resistance state.

FIG. 1 is a cross-sectional schematic diagram of an illustrative spin-transfer torque MTJ memory unit 10 in the low resistance state and FIG. 2 is a cross-sectional schematic diagram of another spin-transfer torque MTJ memory unit 10 in the high resistance state. A magnetic tunnel junction (MTJ) memory unit 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the spin-transfer torque MTJ memory unit 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the spin-transfer torque MTJ memory unit 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the spin-transfer torque MTJ memory unit 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the MTJ memory unit 10 via spin-transfer occurs when a current, passing through a magnetic layer of the MTJ memory unit 10, becomes spin polarized and imparts a spin torque on the free layer 12 of the MTJ 10. When a sufficient spin torque is applied to the free layer 12, the magnetization orientation of the free layer 12 can be switched between two opposite directions and accordingly the MTJ 10 can be switched between the parallel state (i.e., low resistance state or "0" data state) and anti-parallel state (i.e., high resistance state or "1" data state) depending on the direction of the current.

The illustrative spin-transfer torque MTJ memory unit 10 may be used to construct a memory device that includes multiple MTJ memory units where a data bit is stored in spin-transfer torque MTJ memory unit by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque MTJ memory unit 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
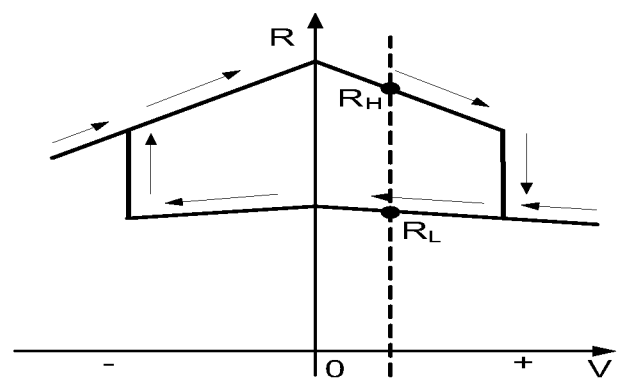
FIG. 3 is a graph of a static R-V (resistance-voltage) curve of a spin-transfer torque MTJ memory unit.

FIG. 3 is a graph of a static R-V sweep curve of a spin-transfer torque MTJ memory unit. When applying a positive voltage on the second electrode 16 in FIG. 1 or 2, the MTJ 10 enters the positive applied voltage region in FIG. 3 and switches from the high resistance state (FIG. 2) to the low resistance state (FIG. 1). When applying a positive voltage on the first electrode 15 in FIG. 1 or 2, the MTJ 10 enters the negative applied voltage region in FIG. 3. The resistance of the MTJ switches from the low resistance state (FIG. 1) to the high resistance state (FIG. 2).

Let $R_H$ and $R_L$ denote the high and low MTJ resistance, respectively. We define the Tunneling Magneto Resistance Ratio (TMR) as TMR=$(R_H-R_L)/R_L$. Here $R_H$, $R_L$ and TMR are determined by also the sensing current or voltage, as shown in FIG. 3. Generally, a large TMR makes it easier to distinguish the two resistance states of the MTJ.

Figure 4:
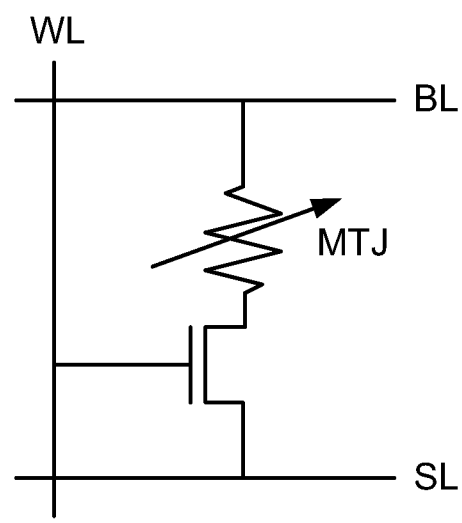
FIG. 4 is a schematic circuit diagram of a spin-transfer torque MTJ memory unit.

FIG. 4 is a schematic diagram of a spin-transfer torque MTJ memory unit MTJ. The spin-transfer torque MTJ memory unit MTJ is electrically connected in series to a transistor such as, for example, a NMOS transistor. The opposing side of the spin-transfer torque MTJ memory unit MTJ is electrically connected to a bit line BL. The transistor is electrically coupled to a source line SL and a word line WL. The MTJ is usually modeled as a variable resistor in circuit schematic, as shown in FIG. 4.

Some spin-transfer torque MTJ memory units MTJ use a sensing scheme that relies on a standard reference voltage to read the resistance value of the MTJ. However, such a sense scheme requires that the maximum bit line voltage for the low resistance state be less than the minimum bit line voltage for the high resistance state for all of the MTJs in a memory array, which may not true when the variation of the MTJ resistance is large.

Figure 5:
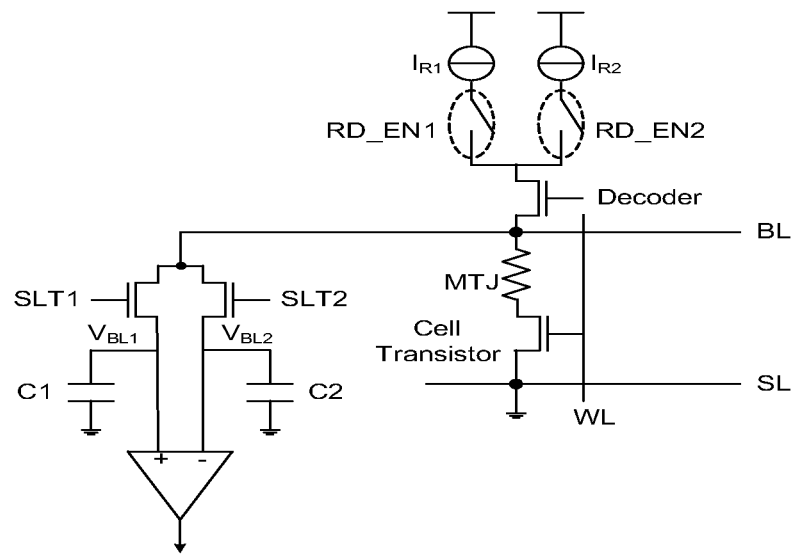
FIG. 5 is a schematic circuit diagram of an illustrative spin-transfer torque MTJ memory apparatus.

FIG. 5 is a schematic circuit diagram of an illustrative spin-transfer torque MTJ memory apparatus. The apparatus includes a magnetic tunnel junction data cell MTJ having a ferromagnetic free layer and a ferromagnetic reference layer separated by an oxide barrier layer, as described above. The magnetic tunnel junction data cell is electrically between a bit line BL and a source line SL. The magnetic tunnel junction data cell MTJ is configured to switch between a high resistance state and a low resistance state by passing a polarized write current through the magnetic tunnel junction data cell MTJ. A cell transistor allows read and write current to flow through the magnetic tunnel junction data cell MTJ. A gate contact of the cell transistor is electrically coupled to a word line WL to allow selection of the particular cell transistor and associated magnetic tunnel junction data cell MTJ.

Figure 7:
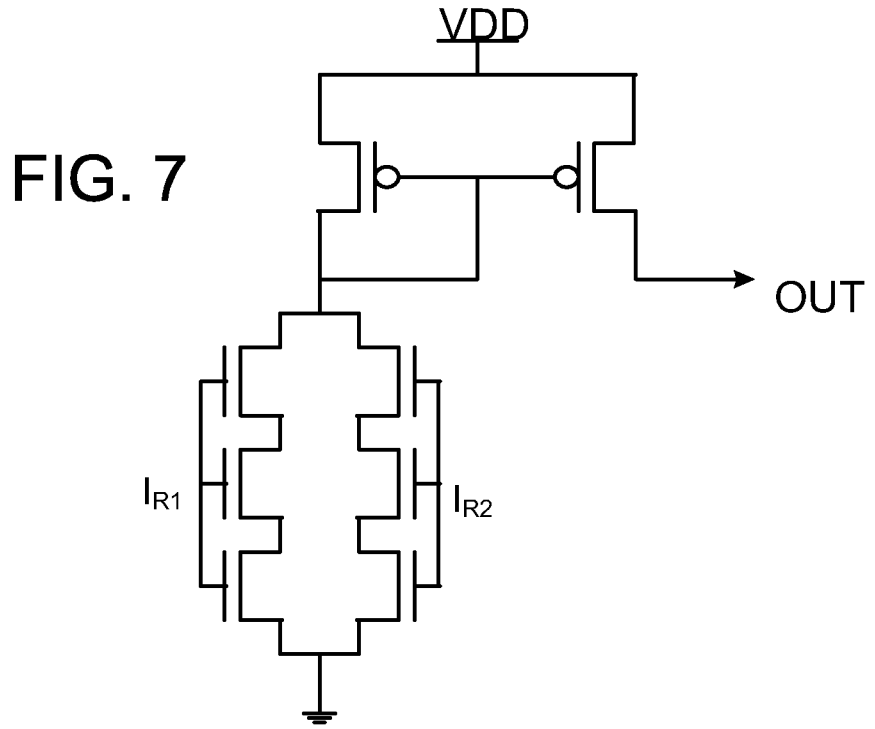
FIG. 7 is a schematic circuit diagram of an illustrative adjustable current driver for FIG. 5.

An adjustable current driver (an illustrative schematic diagram is shown in FIG. 7) is electrically coupled to the bit line BL. The adjustable current driver is configured to provide a first read current $I_{R1}$ and a second read current $I_{R2}$ through the magnetic tunnel junction data cell MTJ. A first voltage storage device C1 is electrically coupled to the bit line BL and configured to store a first bit line voltage $V_{BL1}$ formed by the first read current $I_{R1}$. A second voltage storage device C2 is electrically coupled to the bit line BL and configured to store a second bit line voltage $V_{BL2}$ formed by the second read current $I_{R2}$. In many embodiments, the first voltage storage device C1 and the second voltage storage device C2 are capacitors. Useful capacitors include, for example, NMOS/PMOS capacitors, MIM capacitors, and vertical natural capacitors, among others.

Figure 8:
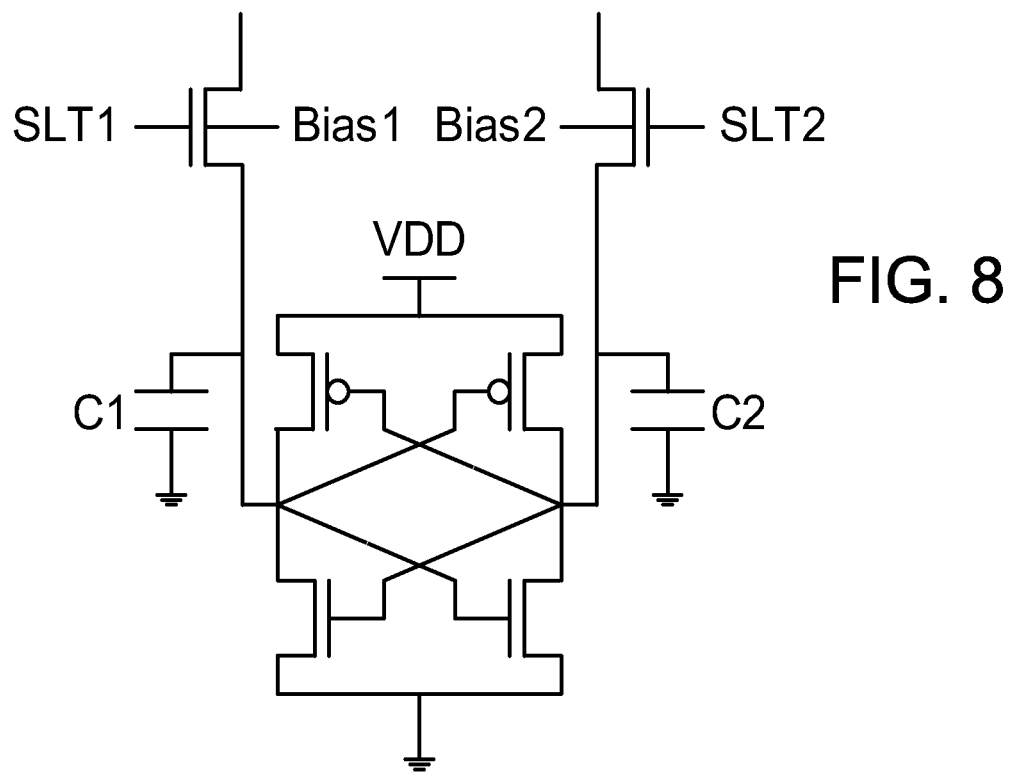
FIG. 8 is a schematic circuit diagram of an illustrative differential sense amplifier for FIG. 5.

A differential sense amplifier (an illustrative schematic diagram is shown in FIG. 8) is electrically coupled to the first voltage storage device C1 and is electrically coupled to the second voltage storage device C2. The differential sense amplifier is configured to compare the first bit line voltage $V_{BL1}$ with the second bit line voltage $V_{BL2}$. A first switch transistor STL1 is electrically connected to the bit line BL and the first voltage storage device C1. A second switch transistor STL2 is electrically connected to the bit line BL and the second voltage storage device C2.

A first read current $I_{R1}$ is applied and incurs the corresponding BL voltage $V_{BL1}$, which is stored in C1. Depending on the resistance state of the MTJ, $V_{BL1}$ can be either $V_{BL,L1}$ or $V_{BL,H1}$, which are the BL voltage for low resistance state of MTJ or high resistance state of MTJ, at $I_{R1}$. Then a low resistance state write "0" current is applied to the MTJ and a value "0" (low resistance state data) is written into the MTJ. A second read current $I_{R2}$ which is larger than $I_{R1}$ is applied and incurs BL voltage $V_{BL2}$, which is stored in C2. The second read current $I_{R2}$ is chosen to make sure that:

$$V_{BL,L1} < V_{BL2} < V_{BL,H1}.$$

In other words, the second read current $I_{R2}$ forms the second bit line read voltage value $V_{BL2}$ that is between a low resistance state voltage value $V_{BL,L1}$ and a high resistance state voltage value $V_{BL,H1}$, of the magnetic tunnel junction data cell MTJ. In some embodiments, the second read current $I_{R2}$ forms the second bit line read voltage $V_{BL2}$ being an average value of a low resistance state voltage value $V_{BL,L1}$ and a high resistance state voltage value $V_{BL,H1}$ of the magnetic tunnel junction data cell MTJ.

By comparing $V_{BL1}$ and $V_{BL2}$ with the differential sense amplifier, the original data resistance state of the MTJ can be readout. If the original state of the MTJ was a high resistance state, the high resistance state needs to be written back into the MTJ. For example, if the first bit line read voltage is greater than the second bit line read voltage then the first resistance state is determined to be a high resistance state. Accordingly, if the first bit line read voltage is less than the second bit line read voltage then the first resistance state is determined to be a low resistance state.

Figure 6:
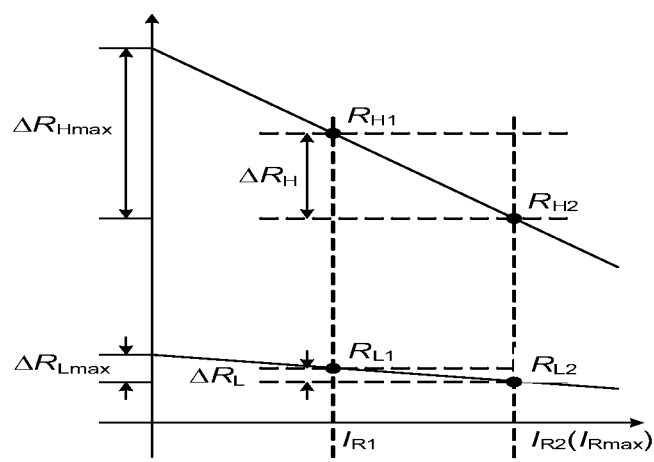
FIG. 6 is a graph of I-R (current-resistance) curves of the MTJ high resistance state and low resistance state.

FIG. 6 is a graph of I-R curves of the MTJ high resistance state and low resistance state. The reference points $R_{L1}$ and $R_{L2}$ refer to the low resistance values (data state "0") of the MTJ at the first read current $I_{R1}$ and the second read current $I_{R2}$, respectively. The reference points $R_{H1}$ and $R_{H2}$ refer to the high resistance values (data state "1") of the MTJ at the first read current $I_{R1}$ and the second read current $I_{R2}$, respectively. The value $\Delta R_{LMAX}$ refers to the change in the MTJ low resistance value from zero to the maximum allowable read current $I_{RMAX}$. The value $\Delta R_{HMAX}$ refers to the change in the MTJ high resistance value from zero to the maximum allowable read current $I_{RMAX}$.

In many embodiments, $I_{R2}$, is chosen to be $I_{RMAX}$. The first read current $I_{R1}$ is less than the second read current. In many embodiments, the first read current $I_{R1}$ is 75% to 99% of the second read current $I_{R2}$. In some embodiments, the first read current $I_{R1}$ is 80% to 90% of the second read current $I_{R2}$.

Figure 9:
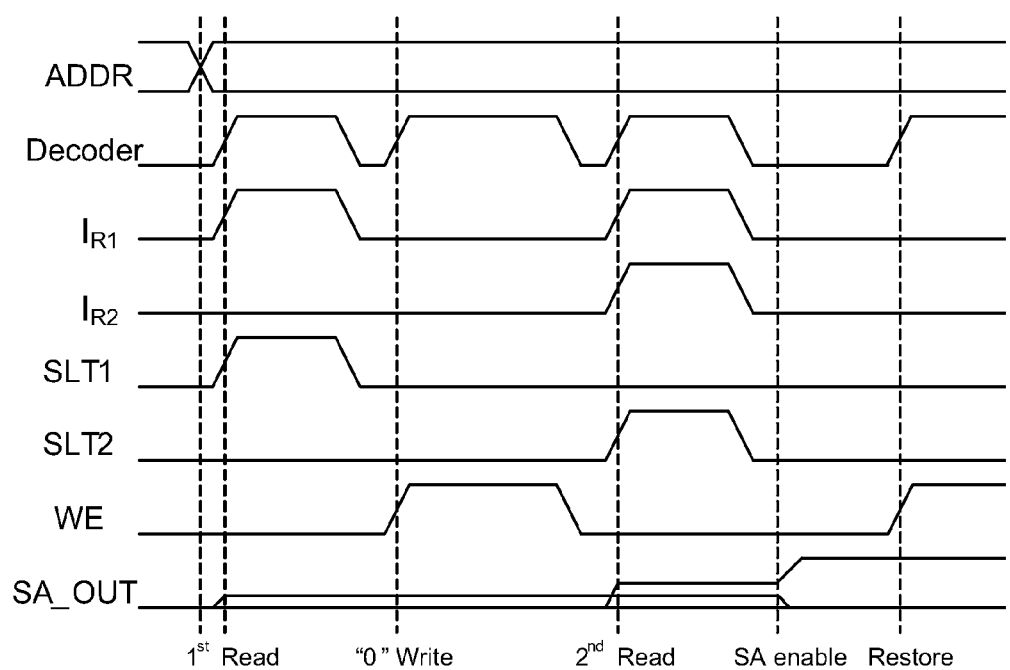
FIG. 9 is a timing diagram for the illustrative spin-transfer torque MTJ memory apparatus of FIG. 5.

FIG. 7 is a schematic circuit diagram of an illustrative adjustable current driver. FIG. 8 is a schematic circuit diagram of an illustrative differential sense amplifier. FIG. 9 is a timing diagram for the illustrative spin-transfer torque MTJ memory apparatus of FIG. 5.

In FIG. 9 the horizontal axis is the time axis. At the time of the $1^{st}$ read, the Decoder, first read current ($I_{R1}$), and first switch transistor (STL1) are all activated and the differential sense amplifier output (SA_OUT) is indicated as a result of the voltage stored in the first voltage storage device. The $1^{st}$ read, Decoder, first read current ($I_{R1}$), first switch transistor (STL1) are then all deactivated prior to the "0" Write. At the time of the "0" Write the write current (WE), Decoder are activated and deactivated prior to the $2^{nd}$ read. At the time of the $2^{nd}$ read the $2^{nd}$ read, Decoder, second read current ($I_{R2}$), and second switch transistor (STL2) are all activated and the differential sense amplifier output (SA_OUT) is indicated as a result of the voltage stored in the second voltage storage device. The $2^{nd}$ read, Decoder, second read current ($I_{R2}$), second switch transistor (STL2) are then all deactivated prior to the differential sense amplifier activation SA Enable to compare the first bit line voltage with the second bit line voltage as described above. Then if the data state needs to be restored, the write current (WE), and Decoder are activated to restore the over-written data state.

Figure 10:
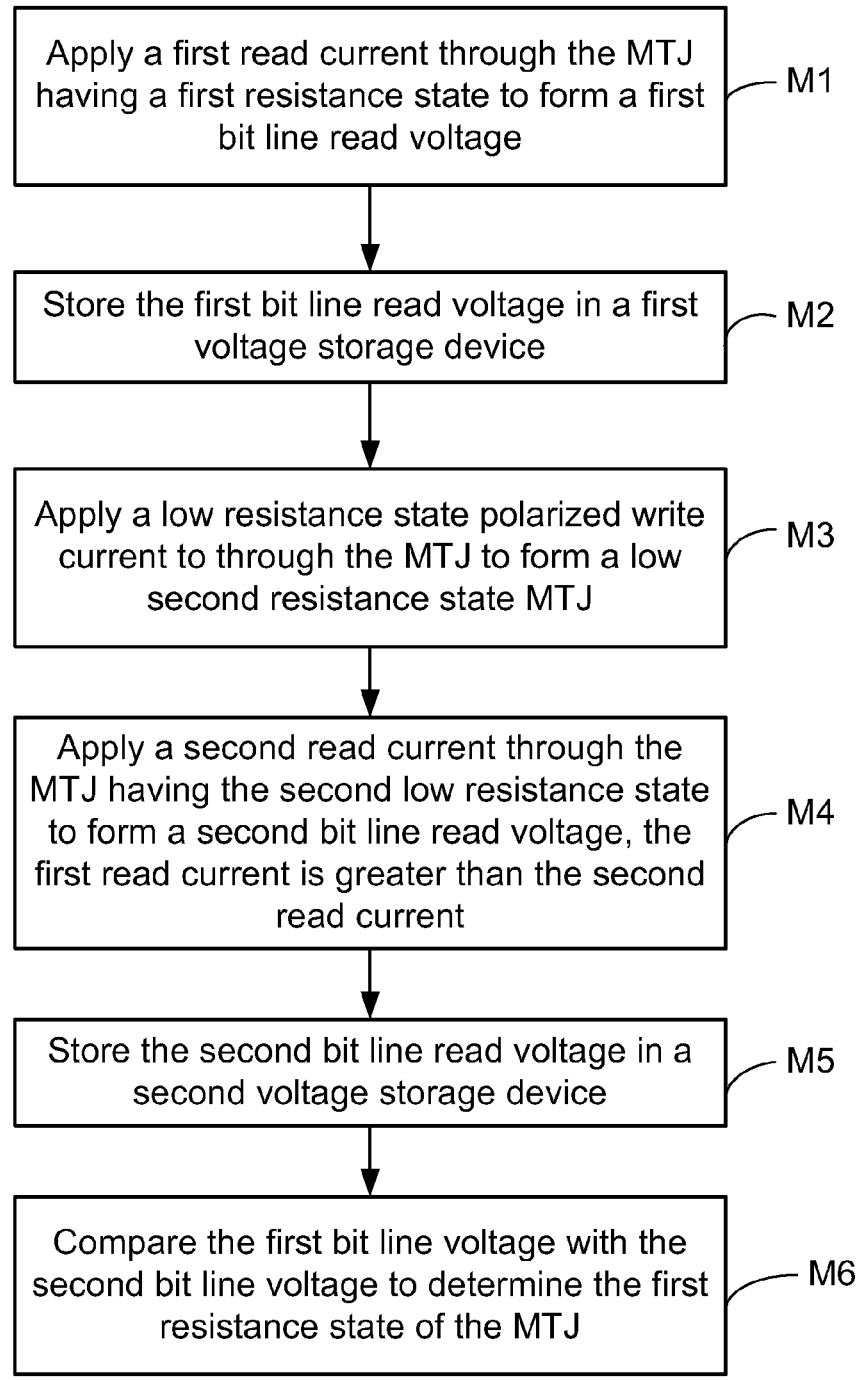
FIG. 10 is a flow diagram of an illustrative self-reference reading method.

FIG. 10 is a flow diagram of an illustrative self-reference reading method. The method includes applying a first read current through a magnetic tunnel junction data cell and forming a first bit line read voltage, the magnetic tunnel junction data cell having a first resistance state at block M1 and storing the first bit line read voltage in a first voltage storage device at block M2. The method then includes applying a low resistance state polarized write current through the magnetic tunnel junction data cell, forming a low second resistance state magnetic tunnel junction data cell at block M3. A second read current is applied through the low second resistance state magnetic tunnel junction data cell to forming a second bit line read voltage, where the first read current is less than the second read current at block M4 and storing the second bit line read voltage in a second voltage storage device at block M5. Then comparing the first bit line read voltage with the second bit line read voltage to determine whether the first resistance state of the magnetic tunnel junction data cell was a high resistance state or low resistance state at block M6. If the original resistance state of the magnetic tunnel junction data cell is determined to be the high resistance state, then a write-back of the high resistance state data value to the magnetic tunnel junction data cell is required.

The comparing block C1 compares the first bit line read voltage ($V_{BL1}$) with the second bit line read voltage ($V_{BL2}$). If the first bit line read voltage ($V_{BL1}$) is greater than the second bit line read voltage ($V_{BL2}$) then the first resistance state of the magnetic tunnel junction data cell is a high resistance state at block D1. If the first bit line read voltage ($V_{BL1}$) is not greater than the second bit line read voltage ($V_{BL2}$) then the first resistance state of the magnetic tunnel junction data cell is a low resistance state block D2.

The comparing step includes comparing the first bit line read voltage with the second bit line read voltage and if the first bit line read voltage is greater than the second bit line read voltage then the first resistance state is determined to be a high resistance state. Accordingly, if the first bit line read voltage is less than the second bit line read voltage then the first resistance state is determined to be a low resistance state.

Figure 11:
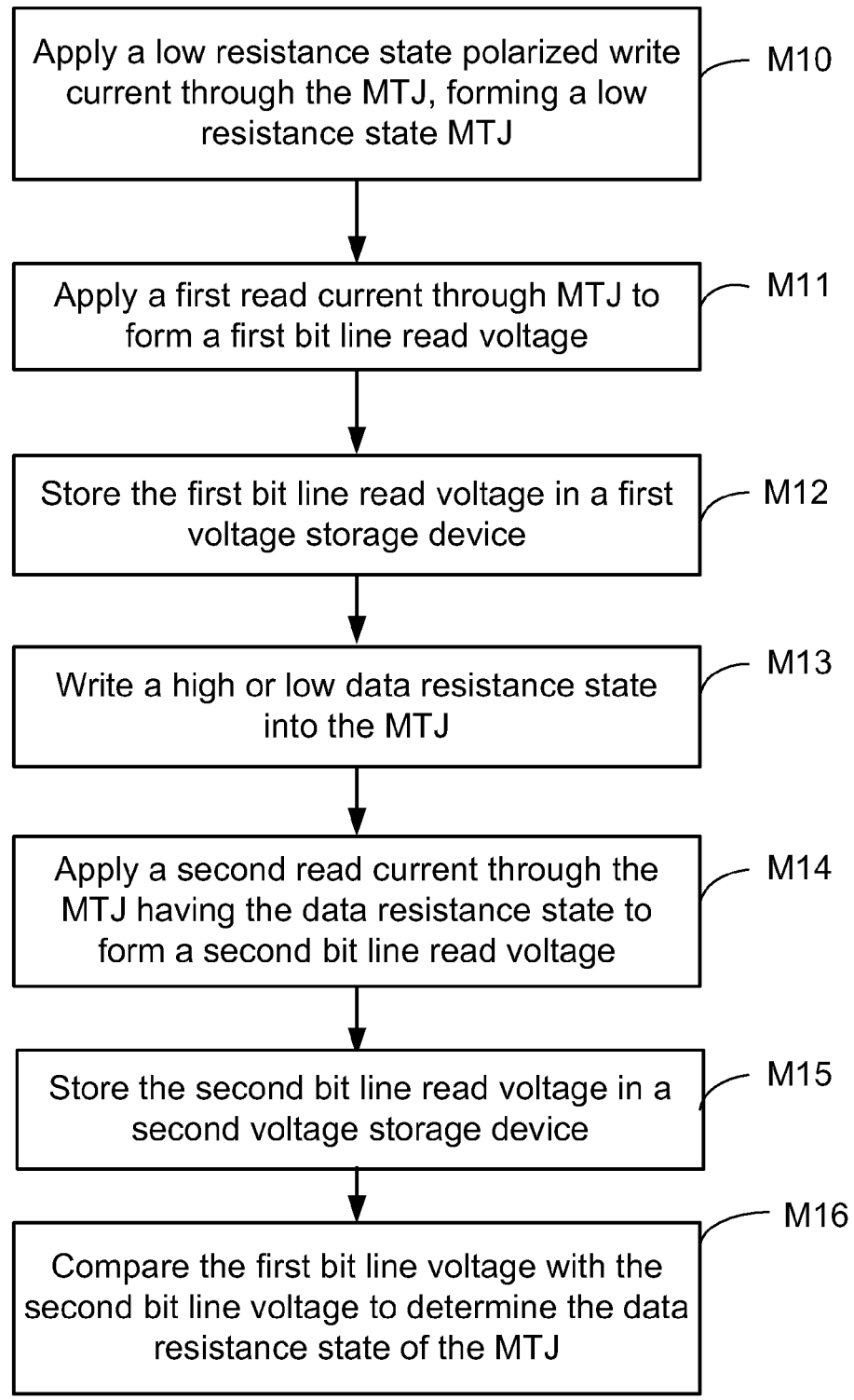
FIG. 11 is a flow diagram of another illustrative self-reference reading method.

FIG. 11 is a flow diagram of another illustrative self-reference reading method. This method can be referred to as a check after write method. This method includes applying a low resistance state polarized write current through the magnetic tunnel junction data cell, forming a low resistance state magnetic tunnel junction data cell at block M10. Then the method includes applying a first read current through a magnetic tunnel junction data cell to form a first bit line read voltage from the low resistance state magnetic tunnel junction data cell at block M11 and storing the first bit line read voltage in a first voltage storage device at block M12. Then the method includes writing a data resistance state into the magnetic tunnel junction data cell, where the data resistance state being either a data high resistance state or a data low resistance state at block M13. A second read current is applied through the data resistance state magnetic tunnel junction data cell and forms a second bit line read voltage at block M14 and the second bit line read voltage is stored in a second voltage storage device at block M15. The method also includes comparing the first bit line read voltage with the second bit line read voltage to determine whether the data resistance state of the magnetic tunnel junction data cell is the data high resistance state or the data low resistance state.

The comparing block C2 compares the first bit line read voltage ($V_{BL1}$) with the second bit line read voltage ($V_{BL2}$). If the first bit line read voltage ($V_{BL1}$) is less than the second bit line read voltage ($V_{BL2}$) then the first resistance state of the magnetic tunnel junction data cell is a high resistance state at block D3. If the first bit line read voltage ($V_{BL1}$) is greater than the second bit line read voltage ($V_{BL2}$) then the first resistance state of the magnetic tunnel junction data cell is a low resistance state block D4.

The comparing step includes comparing the first bit line read voltage with the second bit line read voltage and if the first bit line read voltage is less than the second bit line read voltage then the data resistance state is determined to be the data high resistance state. Accordingly, if the first bit line read voltage is about equal to or greater than the second bit line read voltage then the data resistance state is determined to be the data low resistance state.

Thus, embodiments of the SPIN-TRANSFER TORQUE MEMORY SELF-REFERENCE READ METHOD are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method of self-reference reading a spin-transfer torque memory unit, comprising:
   applying a low resistance state polarized write current through a magnetic tunnel junction data cell, forming a low resistance state magnetic tunnel junction data cell;
   applying a first read current through the magnetic tunnel junction data cell and forming a first bit line read voltage from the low resistance state magnetic tunnel junction data cell;
   writing a data resistance state into the magnetic tunnel junction data cell, the data resistance state being either a data high resistance state or a data low resistance state;

applying a second read current through the desired resistance state magnetic tunnel junction data cell and forming a second bit line read voltage, wherein the first read current is the second read current; and comparing the first bit line read voltage with the second bit line read voltage to determine whether the data resistance state of the magnetic tunnel junction data cell is the data high resistance state or the data low resistance state.

2. A method according to claim 1, wherein the comparing step comprises comparing the first bit line read voltage with the second bit line read voltage and if the first bit line read voltage is less than the second bit line read voltage then the data resistance state is determined to be the high resistance state.

3. A method according to claim 1, wherein the comparing step comprises comparing the first bit line read voltage with the second bit line read voltage and if the first bit line read voltage is greater than the second bit line read voltage then the data resistance state is determined to be the low resistance state.

4. A method according to claim 1, wherein the first read current is 75% to 99% of the second read current.

5. A method according to claim 1, wherein the first read current is 80% to 90% of the second read current.

6. A method according to claim 1, wherein the first read current forms the first bit line read voltage value that is between a low resistance state voltage value and a high resistance state voltage value of the magnetic tunnel junction data cell.

7. A method according to claim 1, wherein the first read current is a maximum read current.

8. A method according to claim 1, wherein the write current is a spin polarized write current.

9. A method according to claim 1, wherein the magnetic tunnel junction data cell comprises an array of spin-transfer torque magnetic tunnel junction data cells.

10. A method according to claim 1, wherein the second read current forms the second bit line read voltage being an average value of a low resistance state voltage value and a high resistance state voltage value of the magnetic tunnel junction data cell.

11. A method of self-reference reading a memory unit, comprising:
applying a low resistance state write current through a magnetic tunnel junction data cell, forming a low resistance state magnetic tunnel junction data cell;
applying a first read current through the magnetic tunnel junction data cell and forming a first bit line read voltage from the low resistance state magnetic tunnel junction data cell;
writing a data resistance state into the magnetic tunnel junction data cell, the data resistance state being either a data high resistance state or a data low resistance state;
applying a second read current through the desired resistance state magnetic tunnel junction data cell and forming a second bit line read voltage, wherein the first read current is greater than the second read current; and
comparing the first bit line read voltage with the second bit line read voltage to determine whether the data resistance state of the magnetic tunnel junction data cell is the data high resistance state or the data low resistance state.

12. A method according to claim 11, wherein the comparing step comprises comparing the first bit line read voltage with the second bit line read voltage and if the first bit line read voltage is less than the second bit line read voltage then the data resistance state is determined to be the high resistance state.

13. A method according to claim 11, wherein the comparing step comprises comparing the first bit line read voltage with the second bit line read voltage and if the first bit line read voltage is greater than the second bit line read voltage then the data resistance state is determined to be the low resistance state.

14. A method according to claim 11, wherein the first read current is 75% to 99% of the second read current.

15. A memory apparatus comprising:
a magnetic tunnel junction data cell electrically coupled to a bit line, the magnetic tunnel junction data cell is configured to switch between a high resistance state and a low resistance state by passing a write current through the magnetic tunnel junction data cell;
an adjustable current driver electrically coupled to the bit line, the adjustable current driver configured to provide a provide a first read current and a second read current through the magnetic tunnel junction data cell;
a first voltage storage device electrically coupled to the bit line and configured to store a first bit line voltage formed by the first read current;
a second voltage storage device electrically coupled to the bit line and configured to store a second bit line voltage formed by the second read current; and
a differential sense amplifier electrically coupled to the first voltage storage device and electrically coupled to the second voltage storage device, the differential sense amplifier configured to compare the first bit line voltage with the second bit line voltage.

16. A memory apparatus according to claim 15, wherein the first voltage storage device is a NMOS or PMOS capacitor.

17. A memory apparatus according to claim 15, wherein the first and second voltage storage devices are NMOS or PMOS capacitors.

18. A memory apparatus according to claim 15, wherein the magnetic tunnel junction data cell is a spin-transfer torque magnetic tunnel junction data cell.

19. A memory apparatus according to claim 15, wherein the magnetic tunnel junction data cell comprises a spin-transfer torque magnetic tunnel junction data cell.

20. A memory apparatus according to claim 15, wherein the magnetic tunnel junction data cell comprises an array of spin-transfer torque magnetic tunnel junction data cells.

* * * * *